(12) United States Patent
Eker

(10) Patent No.: US 6,504,441 B1
(45) Date of Patent: Jan. 7, 2003

(54) VOLTAGE CONTROLLED OSCILLATOR WITH SELECTABLE FREQUENCY RANGE

(75) Inventor: Mehmet M. Eker, Santee, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/708,915

(22) Filed: Nov. 8, 2000

(51) Int. Cl.[7] .............................. H03B 5/20; H03B 5/24
(52) U.S. Cl. ..................... 331/136; 331/34; 331/108 B; 331/175; 331/177 R; 331/179
(58) Field of Search ........................ 331/57, 178, 179, 331/34, 108 B, 135, 136, 137, 175, 177 R

(56) References Cited

U.S. PATENT DOCUMENTS

| 4,884,041 A | * | 11/1989 | Walker ........................ 331/57 |
| 5,272,453 A | | 12/1993 | Traynor et al. |
| 5,349,311 A | * | 9/1994 | Mentzer ...................... 331/57 |
| 5,382,922 A | | 1/1995 | Gersbach et al. |
| 5,446,417 A | | 8/1995 | Korhonen et al. |
| 5,465,076 A | * | 11/1995 | Yamauchi et al. .......... 331/179 |
| 5,477,198 A | | 12/1995 | Anderson et al. |
| 5,629,652 A | | 5/1997 | Weiss |
| 5,757,240 A | * | 5/1998 | Boerstler et al. ............. 331/34 |
| 5,894,246 A | | 4/1999 | Barnett et al. |
| 5,952,892 A | | 9/1999 | Szajda |
| 5,955,928 A | | 9/1999 | Smith et al. |

* cited by examiner

Primary Examiner—David C. Mis
(74) Attorney, Agent, or Firm—Gray Cary Ware & Friedenrich; Terrance A. Meador

(57) ABSTRACT

A frequency sweep voltage controlled oscillator (VCO), with a selectable range of output frequencies is provided. The VCO includes a frequency range circuit to accept an input signal, differentially delay the signal, and selectably sum the delayed signals to provide signals in discrete frequency ranges. A frequency sweep circuit accepts the signal output from the frequency range circuit, differentially delays the signal, and sums the delayed signal in such a way as to modify the previously selected frequency range. A method for generating a signal from a frequency sweep VCO is also provided.

15 Claims, 6 Drawing Sheets

VOLTAGE CONTROLLED OSCILLATOR WITH SELECTABLE FREQUENCY RANGE

BACKGROUND OF THE INVENTION

1. Field of the Invention

This invention relates generally to voltage controlled oscillator (VCO) circuits and, more particularly, to a VCO having a selectable range of operating frequencies and a frequency sweep within the selected range of operating frequencies.

2. Description of the Related Art

A critical part of the phase-locked loop circuits used in frequency generation and data recovery is the VCO. Most VCO analysis has considered only "nearly sinusoidal" oscillations in conventional topologies (such as LC-based circuits), conditions difficult to create in monolithic circuits. For a VCO that is to be used in a PLL, the following parameters are important. 1) Tuning range: i.e., the range between the minimum and maximum values of the VCO frequency. In this range, the variation of the output amplitude and jitter must be minimal. The tuning range must accommodate the PLL input frequency range as well as process- and temperature-induced variations in the VCO frequency range. The tuning range is typically at least ±20% $w_{FR}$. 2) Jitter and phase noise: timing accuracy and spectral purity requirements in PLL applications impose an upper bound on the VCO jitter and phase noise. 3) Supply and substrate noise rejection: if integrated along with digital circuits, VCOs must be highly immune to supply and substrate noise. Such effects become more prominent if a PLL shares the same substrate and package with a large digital processor. 4) Input/output characteristic linearity: variation of $K_{VCO}$ across the tuning range is generally undesirable. If a PLL is used as an FM demodulator, the variation of $K_{VCO}$ introduces harmonic distortion in the detected signal and must be below 1%. In other applications, this non-linearity degrades the loop stability but it can be as high as several tenths of a percent.

In order to achieve high rejection of supply and substrate noise, both the signal path and the control path of a VCO must be fully differential. An oscillator in which signals exist in complementary form, having rail-to-rail swings, is not considered differential because it exhibits poor supply rejection. Differential operation also yields a 50% duty cycle, an important requirement in timing applications, and is immune to the up-conversion of low-frequency noise components in the signal path.

A common oscillator topology in monolithic PLLs is the ring oscillator. Here, a cascade of M gain stages with a total (dc) phase shift of 180° is placed in a feedback loop. It can be easily shown that the loop oscillates with a period equal to $2MT_d$, where $T_d$ is the delay of each stage with a fanout of one. The oscillation can also be viewed as occurring at the frequency for which the total phase shift is zero and the loop gain is unity. Since, the gate delay is monitored and controlled within the process corners, the oscillator frequency and its variation can be predicted with reasonable accuracy.

In order to vary the frequency of oscillation, one of the parameters in $2MT_d$ must change, i.e., the effective number of stages or the delay of each stage. In one approach, called "delay interpolation", a fast path and a slow path are used in parallel. The total delay is adjusted by increasing the gain of one path and decreasing that of the other, and hence is a weighted sum of the delays of the two paths. In a second approach, the delay of each stage in the ring is directly varied with negligible change in the gain or voltage swings. In some prior art circuits, the delay of each stage is tuned by the control input. This can be accomplished by varying the capacitance or the resistance seen at the output node of each stage.

An important issue in ring oscillator design is the minimum number of stages that can be used while attaining reliable operation. Since oscillation occurs at a frequency for which the total phase shift is zero and the loop gain is unity, as the number of stages decreases, the required phase shift and (dc) gain per stage increase. For example, for a three-stage oscillator, each stage must introduce a phase shift of 120° and a minimum dc gain of 2. While two-stage bipolar oscillators can be designed to achieve both sufficient phase shift and high speed, it is known that CMOS implementations with only two stages either do not operate reliably or, if they employ additional phase shift elements, oscillate no faster than three-stage configurations. Thus, CMOS VCOs typically utilize three or more stages.

A low VCO gain is a desirable feature as it reduces the circuit noise effects at the VCO output. Therefore, less jittery, more stable VCO output is possible even with lots of power supply noise. However, many VCOs are powered with supply voltages of 1.8 Volts or even lower. Even though the low power supply voltage does not limit the oscillation frequency of a VCO, it puts a limit on the control voltage range in which VCO frequency is swept linearly. As $\Delta V$ gets smaller with low supply voltage values, the VCO gain becomes larger. To make the matters even worse, the process and temperature variations in CMOS circuits mandate that Fmax and Fmin must be farther apart from each other to ensure the coverage of the actual operating frequency of interest under any condition, and thus causing even higher VCO gain.

It would be advantageous if a VCO could generate a low noise output signal, even when powered from a low voltage power supply.

It would be advantageous if the above-mentioned VCO had a selectable frequency range that could be used in acquisition or tracking modes.

It would be advantageous if the above-mentioned VCO had a selectable frequency range to mitigate the gain requirements.

SUMMARY OF THE INVENTION

Accordingly, a VCO with variable frequency range is provided. The frequency range in which a VCO is designed to operate is very much process dependent. In some cases, due to process variations, a VCO can be fabricated to supply a range of frequencies, in response to an input voltage range, that does not coincide with the actual operating frequency. The present invention selectable frequency VCO reduces the occurrence of such an event, resulting in high yields in manufacturing such chips.

More particularly, the VCO comprises a frequency range circuit to select a VCO signal frequency range and a frequency sweep circuit to modify the selected range of VCO signal frequencies. The frequency sweep circuit includes a first delay section to delay an input signal a first delay and a second delay section to delay an input signal a second delay, less than the first delay. The variable delay circuit supplies a VCO signal that is a variable sum of the signals with the first and second delays.

The frequency range circuit includes a third delay section to delay an input signal a third delay and a fourth delay section to delay an input signal a fourth delay, less than the third delay. The frequency range circuit has an output connected to the input of the frequency sweep circuit, that is a selected sum of the signals with the third and fourth delays.

The frequency sweep circuit accepts converted control signals in a first range of currents and a second range of currents, less than the first range. The VCO supplies a VCO signal frequency and a range of potential VCO frequencies in response to the converted control signal current.

A converter circuit accepts a control voltage and supplies a converted control signal. A sweep window control input is used to select a converted control signal with the first range of current values or a converted control signal with the second range of current values.

Additional details of the VCO converter circuit, frequency range select, and frequency sweep circuits are provided in the detailed description of the invention below. Also provided is a method for generating a signal with a frequency sweep VCO.

DETAILED DESCRIPTION OF THE PREFERRED EMBODIMENTS

Figure 1:
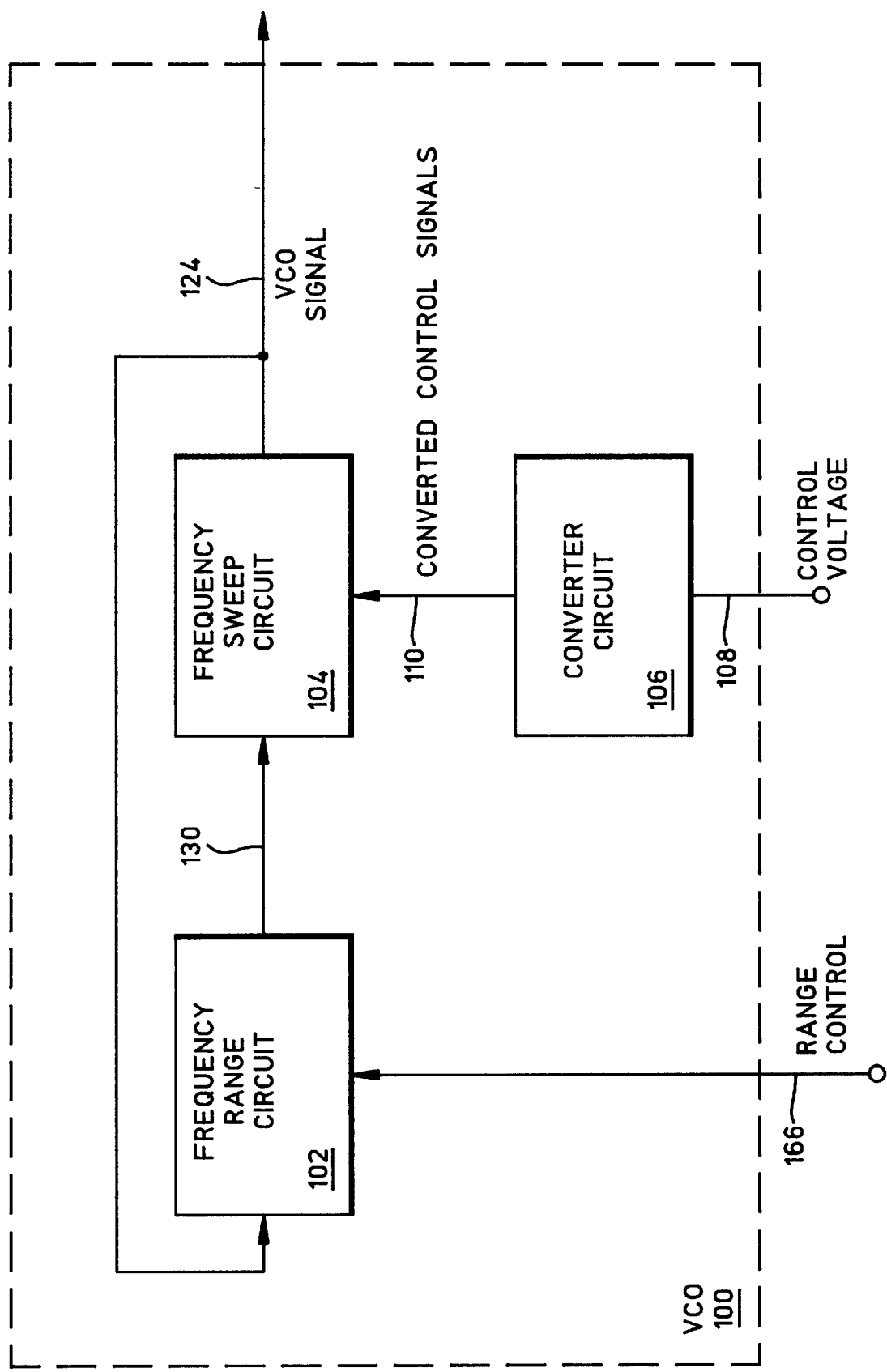
FIG. 1 a simplified block diagram schematic of the variable range VCO of the present invention.

FIG. 1 is a simplified block diagram schematic of the variable range VCO of the present invention. The VCO 100 comprises a frequency range circuit 102 to select a VCO signal frequency range from a plurality of frequency ranges, and a frequency sweep circuit 104 connected to the frequency range circuit 102 to modify the selected range of VCO signal frequencies. The VCO further comprises a converter circuit 106 having an input to accept a control voltage on line 108 and an output on line 110 for supplying a converted control signal. The gain control input on line 108 is used to select a converted control signal on line 110 with the first range of current values and a converted control signal with the second range of current values. The frequency sweep circuit 104 includes an input connected to the converted circuit output on line 110 to accept the converted control signal. The frequency sweep circuit 104 sums delays in response to the converted control signal.

Figure 2:
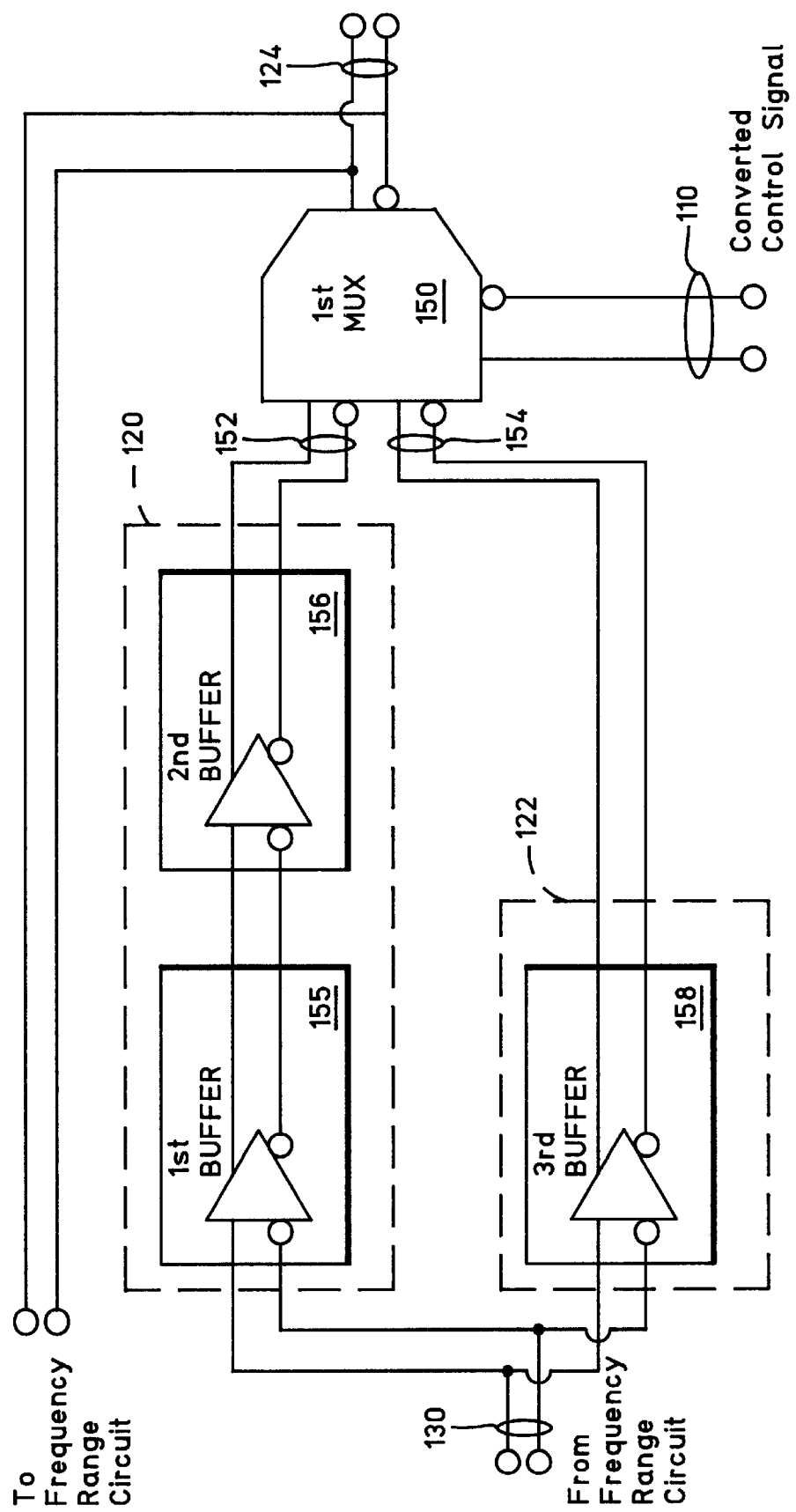
FIG. 2 is a schematic block diagram illustrating the frequency sweep circuit of FIG. 1 in greater detail.

FIG. 2 is a schematic block diagram illustrating the frequency sweep circuit 104 of FIG. 1 in greater detail. The frequency sweep circuit 104 includes a first delay section 120 to delay an input signal a first delay and a second delay 122 section to delay an input signal a second delay, less than the first delay. The variable delay circuit has an output on line 124 to supply a VCO signal that is a variable sum of the signals with the first and second delays.

Figure 3:
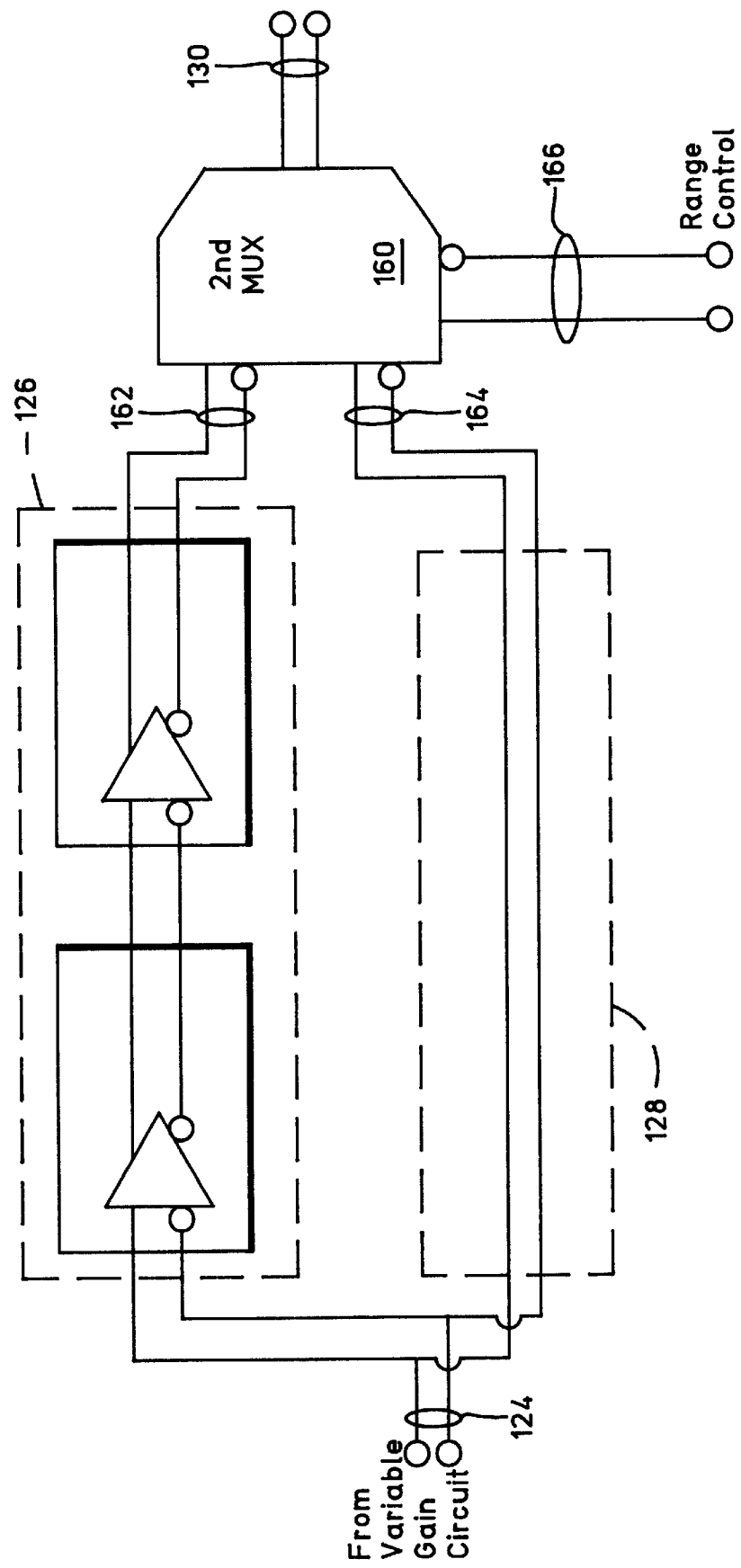
FIG. 3 is a schematic block diagram of the frequency range circuit of FIG. 1 in greater detail.

FIG. 3 is a schematic block diagram of the frequency range circuit 102 of FIG. 1 in greater detail. The frequency range circuit 102 includes an input connected to the output of the frequency sweep circuit on line 124. The frequency range circuit 102 has a third delay section 126 to delay an input signal a third delay and a fourth delay section 128 to delay an input signal a fourth delay, less than the third delay. The frequency range circuit 102 has an output connected to the input of the frequency sweep circuit on line 130, that is a selected sum of the signals with the third and fourth delays.

Returning to FIG. 2, the frequency sweep circuit 104 further includes a first multiplexor (MUX) 150 having a first signal input 152 connected to the output of the first delay section 120, a second signal input 154 connected to the output of the second delay section 122, a control input on line 110 to accept converted control signals, and an output to provide the summed signals on line 124 in response to the converted control signals on line 110.

The frequency sweep circuit 104 first delay section 120 includes a first sequence of series connected delay elements. A depicted, the first delay section 120 includes a first buffer 155 and a second buffer 156. The second delay section 122 includes a second sequence of series connected delay elements. As depicted, the second delay section 122 includes a third buffer 158.

Neither delay section is dependent on any particular number of buffers. Instead, the number of buffers, the type of buffers, and delay associated with each buffer can be varied to yield different frequency ranges. Further, there are many electronic elements besides a buffer which can be used as a delay element. More critical is the actual delay between each delay section and difference of the two delays.

It should also be noted that the signal lines of FIGS. 2 and 3 are drawn as differential signal lines. The present invention is equally applicable to a VCO using single-ended or differential signal lines for the VCO output, control, and intermediate signals.

Returning to FIG. 3, the frequency range circuit 102 further includes a second MUX 160 having a first signal input connected to the output of the third delay section 126 on line 162, a second signal input connected to the output of the fourth delay section 128 on line 164, a control input on line 166 to accept range control commands, and an output on line 130 to provide the summed signals in response to the range control commands. The frequency range circuit 102 third delay section 126 includes a sequence of at least one series connected delay element. As depicted, the third delay section 126 includes a single buffer, fourth buffer 168. The fourth delay section 128 is depicted as having no delay elements. Once again, the invention is not dependent upon any particular number or type of delay elements, and is dependent, rather, upon the absolute delay of each delay section and the difference between delay sections.

The second MUX 160 accepts a predetermined plurality of discrete range control commands on line 166, and in response supplies signals on line 130 in a corresponding plurality of discrete frequency ranges. For example, a first range control command may cause the second MUX 160 to sum the delays in such a manner to supply output frequencies in the range from 1000 to 2000 MHz. A second range control command may cause the second MUX 160 to supply output frequencies in the range from 2000 to 4000 MHz. The above example is not intended to limit the invention to any particular number of frequency ranges or frequency values.

Returning to FIG. 2, the first MUX 150 accepts converted control signals on line 110 in a first range of currents and a second range of currents, less than the first range. The first MUX 150 supplies a VCO signal frequency on line 124 in response to the converted control signal current on line 110.

Since the first MUX 150 is responsive to current, the first MUX 150 supplies a variable range of VCO frequency sweep window in response to the current range of the converted control signals. Alternately stated, the range select circuit 102 selects the general frequency range of the VCO, while the frequency sweep circuit 104 widens or narrows the frequency sweep window of the selected frequency range.

Figure 4:
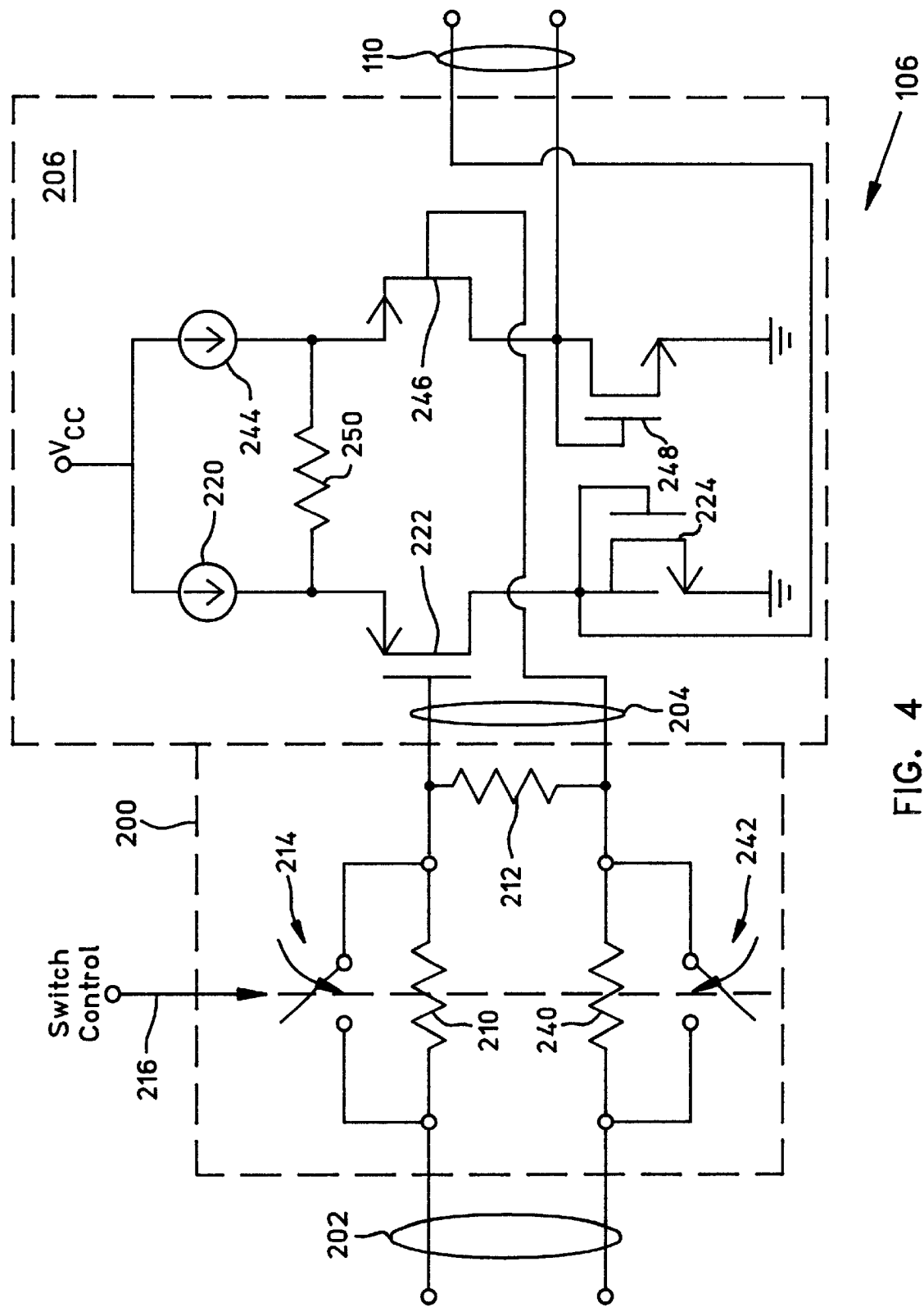
FIG. 4 is a schematic block diagram of the converter circuit of FIG. 1 in greater detail.

FIG. 4 is a schematic block diagram of the converter circuit 106 of FIG. 1 in greater detail. A selectable voltage attenuator 200 has an input on line 202 and an output on line 204. The selectable voltage attenuator input on line 202 accepts a control voltage such as the control signal provided to input 108 and supplies a selectable attenuated control voltage on line 204. A voltage-to-current converter (VCC) circuit 206 has an input on line 204 and an output on line 110. The VCC input on line 204 is connected to the selectable voltage attenuator output to supply the converted control signal, with a current that is proportionally related to the selectable attenuated control voltage.

The selectable voltage attenuator 202 includes a first resistor 210 having an input and an output, with the input connected to the voltage control input on line 202 and an output on line 204 to supply the selectable attenuated control voltage. A second resistor 212 has an input and an output, with the input connected to the first resistor output on line 204 and the output connected to attenuate the control voltage. Specifically, a differential converter circuit is depicted having differential signal lines. In the single-ended signal line aspect of the invention, the output of the second resistor 212 would be connected to ground (not shown).

A first switch 214 has a signal input connected to the first resistor input on line 202, a signal output connected to the first resistor output on line 204, and a control input on line 216 to select the switch position. The converted control signal first current range is supplied when the first switch 214 is closed and the converted control signal second current range is supplied when the first switch 214 is open.

The VCC 206 includes a first current source 220, typically a FET or bipolar transistor, having an input connected to a first voltage source (Vcc) and an output. A first FET 222 has a source connected to the current source 220, a gate connected to the output of the selectable voltage attenuator first resistor on line 204, and a source to supply the converted control signal. A second FET 224 has a drain connected to the drain of the first FET 222 and its own gate, and a source connected to a second voltage source having a potential less than the first voltage source (ground). As shown, the first and second FETs 222 and 224 are N-channel and P-channel devices, respectively. However, there are many other amplifier configurations or arrangement of FETs and bipolar transistors that can accomplish the same function as the depicted VCC 206. That is, the present invention is not limited to the VCC example shown in FIG. 4.

Although the VCO in FIGS. 1 through 4 has been described as having single-ended signal lines, with respect to a dc voltage or ground, the figures show a differential implementation which is useful in some aspects of the invention. Thus, the frequency sweep circuit 104 (FIG. 2) has differential converter control signal inputs on line 110, differential signal inputs on line 130, and differential signal outputs on line 124. Also, the first and second delay sections 120 and 122 have differential signal inputs and outputs. Likewise, the frequency range circuit 102 (FIG. 3) has differential range command inputs on line 166, differential signal inputs on line 124, and differential signal outputs on line 130. Also, the first and second delay sections 126 and 128 have differential signal inputs and outputs.

Returning to FIG. 4, a differential control voltage is provided on lines 202. The selectable voltage attenuator first resistor 210 input accepts a first differential control signal and the first resistor 210 output supplies a first differential selectable attenuated voltage on line 204. The selectable voltage attenuator 200 further includes a third resistor 240 having an input and an output, with the input connected to a second differential control voltage on line 202 and an output to supply the second differential selectable attenuated voltage on line 204. A second switch 242 has a signal input connected to the third resistor input on line 202, a signal output connected to the third resistor output on line 204, and a control input to select the switch position on line 216. Typically, in differential configuration, the output of the second resistor 212 is connected to the output of the third resistor 240.

Thus, the differential converted control signals with the first current range are supplied when the first and second switches 214/242 are closed and the differential converted control signals with the second current range are supplied when the first and second switches 214/242 are open.

The differential VCC 206 further includes a second current source 244 having an input connected to the first voltage source and an output. A third FET 246 (P-channel) has a source connected to the output of the second current source, with a gate connected to the output of the selectable voltage attenuator third resistor 240, to supply a differential converted control signal. A fourth FET 248 (N-channel) has a drain connected to the drain of the fourth FET and its own gate, and a source connected to the second voltage source. A fourth resistor 250 is connected between the outputs of the first and second current source 220/244.

Figure 5:
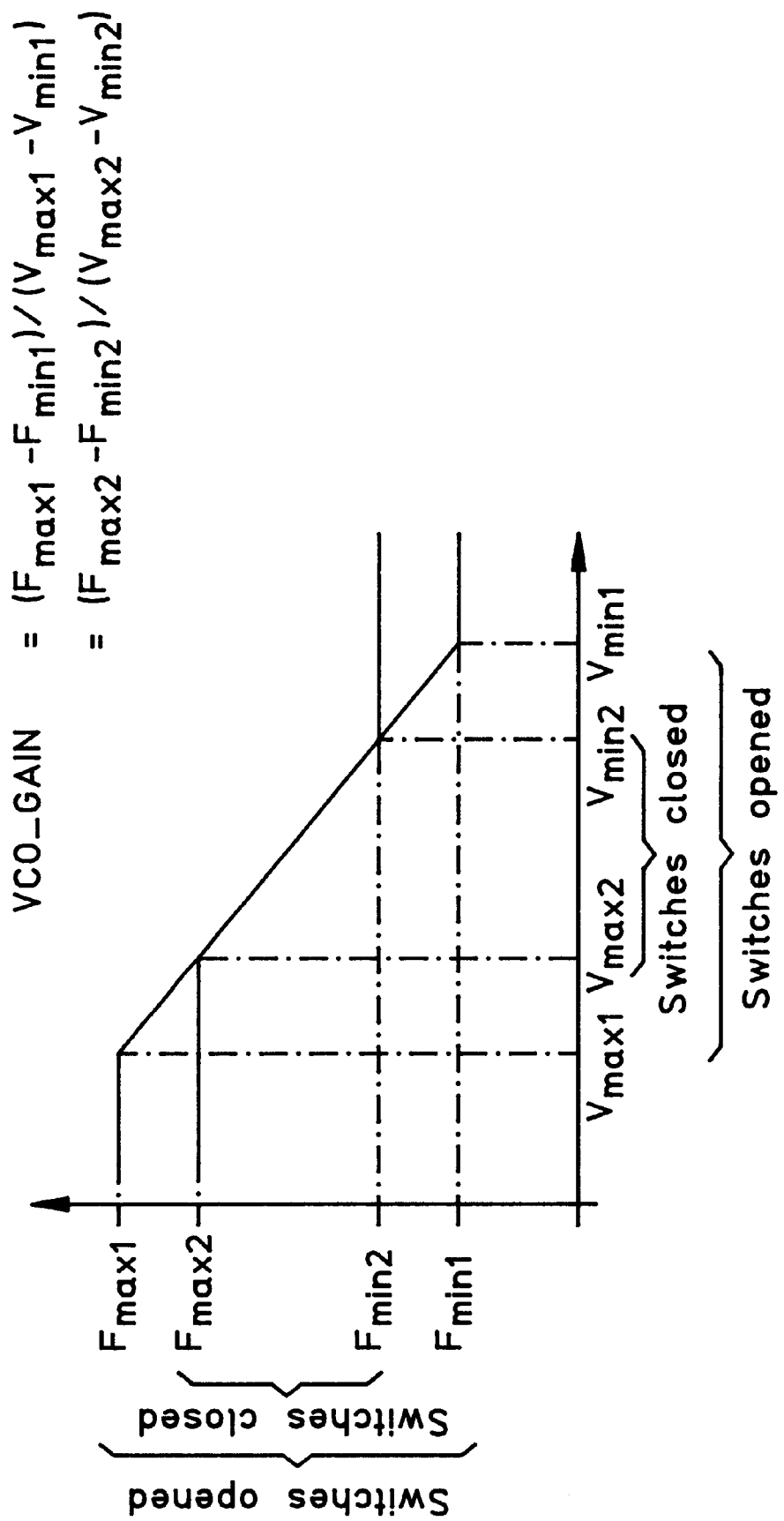
FIG. 5 illustrates the relationship between the control voltage and the frequency range of the VCO of FIG. 1.

FIG. 5 illustrates the relationship between the control voltage and the frequency range of the VCO of FIG. 1. As is well known, the VCO gain is related to frequency as follows:

$$\text{VCO\_Gain} = \frac{F_{\max} - F_{\min}}{\Delta V}$$

Thus, if the change in the control voltage range remains proportional to the change in the frequency range, the VCO gain remains constant. The current dependent gain selection is performed in the converter circuit.

The VCO frequency range is designed to be variable, while the gain of the VCO remains constant. The selectable voltage attenuator is used to limit the maximum and minimum obtainable frequencies, regardless of the selected frequency range. When the switches are closed, the maximum obtainable frequency is lower than when the switches are open, and the minimum obtainable frequency is higher than when the switches are open. That is, the separation, or sweep window between Fmax and Fmin is made smaller by closing the switches. When the switches are open, the maximum obtainable frequency is the highest and the minimum obtainable frequency is the lowest, as the separation between Fmax and Fmin is greater. In neither case does the gain of the VCO change. From FIG. 5, it can be seen that the VCO gain curve remains constant despite the switch position.

Figure 6:
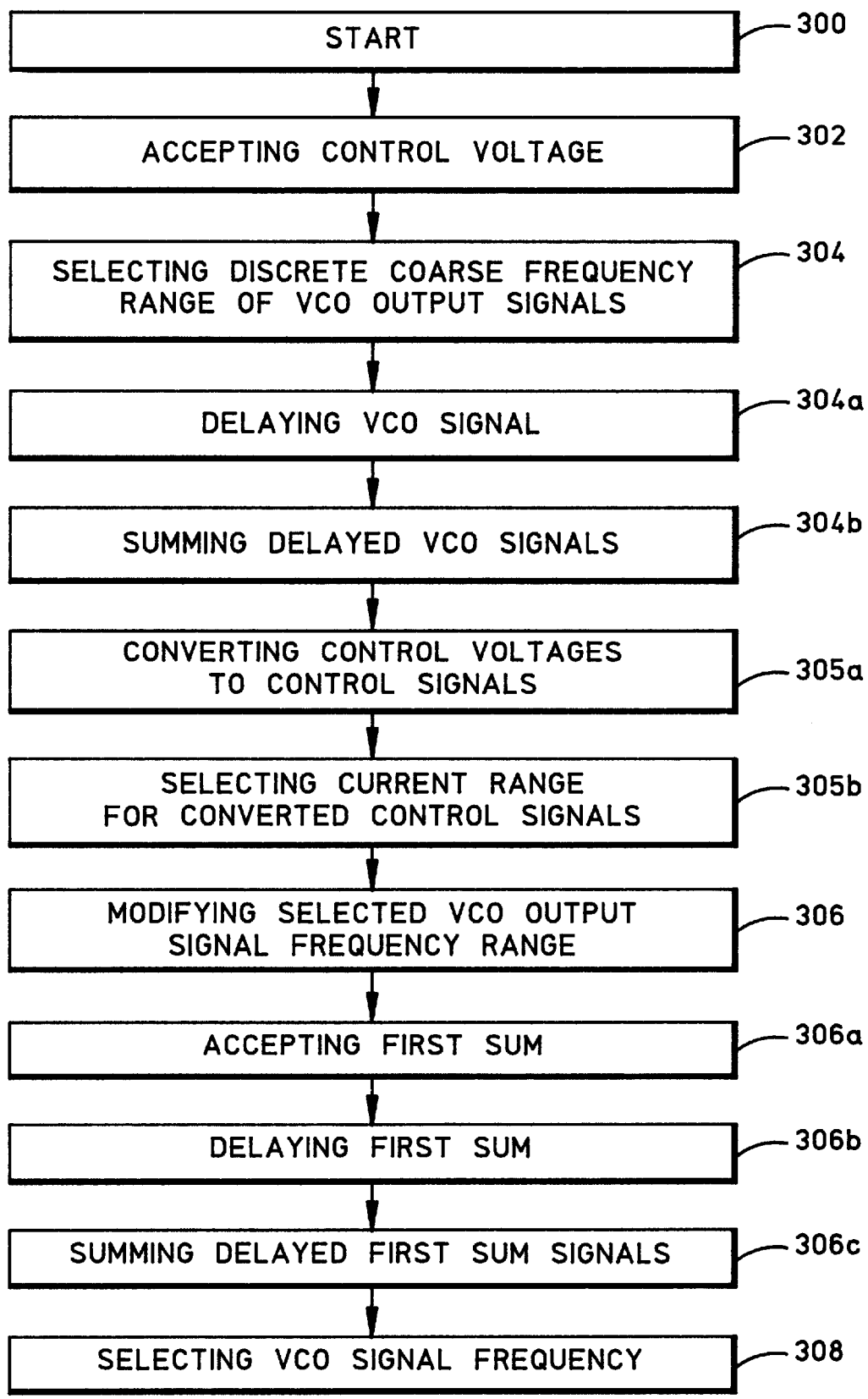
FIG. 6 is a flowchart depicting a method for generating a signal with a variable range voltage controlled oscillator (VCO).

FIG. 6 is a flowchart depicting a method for generating a signal with a variable range voltage controlled oscillator (VCO). Although the method is depicted as a sequence of numbered steps for clarity, no order should be inferred from the numbering unless explicitly stated. Step 300 is the start. Step 302 accepts a control voltage. Step 304 selects a discrete coarse frequency range of VCO output signals from a plurality of frequency ranges. Step 306 modifies the selected VCO output signal frequency range in response to the control voltages.

Step 305a converts the control voltages to control signals having a current proportionally related to the control voltage. Then, Step 305b selects a current range for the converted control signals. In some aspects of the invention, modifying the selected VCO output signal frequency range in response to the control voltages in Step 306 includes varying the selected VCO output signal frequency range in response to the selected converted control signal current range.

In some aspects include a further step. Step 308 selects the VCO signal frequency in response to the converted control signal current.

In some aspects of the invention, modifying the selected VCO output signal frequency range in response to the converted control signal current range in Step 306 includes varying the frequency sweep window of the VCO in response to the converted control signal current range.

In some aspects of the invention, selecting a discrete coarse frequency range of VCO output signals from a plurality of frequency ranges in Step 304 includes sub-steps. Step 304a differentially delays the VCO signal. Step 304b selectively sums the delayed VCO signals to create a first sum.

In some aspects of the invention, modifying the selected VCO output signal frequency range in response to the control voltages in Step 306 includes sub-steps. Step 306a accepts the first sum. Step 306b differentially delays the first sum. Step 306c variably sums the delayed first sum signals in response to the control voltage.

A frequency sweep VCO and method for generating a signal with a frequency sweep VCO have been provided above. Specific examples of a circuit have been shown and described to enable the invention, however, the invention is not limited to merely these examples. For example, the invention can be enabled through delay mechanisms other than the buffers shown in FIGS. 2 and 3. Likewise, the voltage converter circuit shown in FIG. 4 is only one of many possible ways to selectably attenuate a voltage for conversion into ranges of current. Other variations and embodiments of the invention will occur to those skilled in the art.

I claim:

1. A voltage controlled oscillator comprising:
a frequency range circuit with an input for receiving a differential input signal and an input for receiving a range control command, the frequency range circuit for delaying the differential input signal in accordance with the range control command to form a delayed differential signal; and
a frequency sweep circuit with an input for receiving the delayed differential signal and an input for receiving a converted control signal, the frequency sweep circuit for further delaying the delayed differential signal in accordance with the converted control signal to produce a feedback signal provided as the differential input signal to the frequency range circuit, the frequency sweep circuit comprising:
an analog multiplexor with a control input for receiving the converted control signal; and
a plurality of delay sections connected in parallel between the frequency range circuit and the analog multiplexor;
the analog multiplexor responsive to the converted control signal for forming the feedback signal by combining delayed signals produced by the plurality of delay sections.

2. A voltage controlled oscillator in accordance with claim 1, wherein a total delay, equal to the sum of the delay of the frequency range circuit and the delay of the frequency sweep circuit, determine a frequency of oscillation of the voltage controlled oscillator.

3. A voltage controlled oscillator in accordance with claim 2 wherein the frequency sweep circuit includes a first delay section to delay the delayed differential signal by a first delay and a second delay section to delay delayed differential signal by a second delay, less than the first delay, the analog multiplexor having an output to supply the feedback signal that is a variable sum of the signals having the first and second delays.

4. A voltage controlled oscillator in accordance with claim 3 wherein the frequency range circuit includes an input connected to the output of the frequency sweep circuit, the frequency range circuit having a third delay section to delay the differential input signal a third delay and a fourth delay section to delay the differential input signal a fourth delay, less than the third delay.

5. A voltage controlled oscillator in accordance with claim 4, wherein the frequency range circuit further comprises digital multiplexor having a first signal input connected to the output of the third delay section, a second signal input connected to the output of the fourth delay section, a control input to accept the range control commands, the digital multiplexor producing the delayed differential signal by passing a signal produced at the output of a selected delay section of the third delay section and the fourth delay section to pass a selected signal having a delay in accordance with the range control command.

6. A voltage controlled oscillator in accordance with claim 5, wherein the analog multiplexor of the frequency sweep circuit comprises a first signal input connected to the output of the first delay section, a second signal input connected to the output of the second delay section, a control input to accept the converted control signal, the multiplexor producing the feedback signal that is a sum of the delayed signals produced by the first and second delay sections in accordance with the converted control signals.

7. A voltage controlled oscillator in accordance with claim 6, wherein the first delay section of the frequency sweep circuit includes a first sequence of series connected delay elements and the second delay section of the frequency sweep circuit includes a second sequence of series connected delay elements.

8. A voltage controlled oscillator in accordance with claim 7, wherein the third delay section of the frequency range circuit includes a sequence of at least one series connected delay element.

9. A voltage controlled oscillator in accordance with claim 8, wherein the another multiplexor of the frequency range circuit accepts a predetermined plurality of discrete range control commands and the another multiplexor supplies delayed differential signals in a corresponding plurality of discrete frequency ranges in response to the range control commands.

10. A method of producing an oscillating output signal, the method comprising:
providing a differential input signal:
producing a plurality of delayed signals from the differential input signal;
providing a frequency range command;
delaying the differential input signal in accordance with the frequency range command by selecting one of the plurality of delayed signals;

delaying further the selected delayed signal by a plurality of delays to produce a plurality of delayed differential signals;

providing a control signal; and combining, in accordance with the control signal, the plurality of delayed differential signals to form the output signal.

11. A method in accordance with claim 10, wherein the delaying further comprises delaying the selected signal through a plurality of parallel delay sections to form the plurality of delayed differential signals.

12. A method in accordance with claim 11, wherein the control signal is a differential control signals and wherein the combining comprises combining the plurality of delayed differential signals in an analog multiplexor by combining at least a portion of each of the plurality of delayed differential signals in accordance with a voltage difference between two signals of the differential control signal.

13. A method in accordance with claim 12, wherein the delaying the differential input signal comprises delaying the differential signal through at least two delay sections.

14. A method in accordance with claim 13, wherein at least one of the delay sections provides no delay.

15. A method in accordance with claim 14, wherein the delaying the differential input signal further comprises:

selecting a selected signal produced at an output of one of the delay sections having a delay corresponding to the frequency range command.

* * * * *

UNITED STATES PATENT AND TRADEMARK OFFICE
CERTIFICATE OF CORRECTION

PATENT NO.    : 6,504,441 B1
DATED         : January 7, 2003
INVENTOR(S)   : Eker et al.

It is certified that error appears in the above-identified patent and that said Letters Patent is hereby corrected as shown below:

<u>Title page,</u>
Item [12], change "Eker" to -- Eker et al --
Item [75], add -- Joseph James Balardeta, Carlsbad, California --

Signed and Sealed this

Tenth Day of June, 2003

JAMES E. ROGAN
*Director of the United States Patent and Trademark Office*